United States Patent [19]

Yuzurihara

[11] Patent Number: 4,605,865
[45] Date of Patent: Aug. 12, 1986

[54] INPUT DRIVE APPARATUS FOR POWER TRANSISTOR

[75] Inventor: Itsuo Yuzurihara, Zama, Japan

[73] Assignee: Kyosan Electric Co., Ltd., Kanagawa, Japan

[21] Appl. No.: 624,633

[22] Filed: Jun. 26, 1984

[30] Foreign Application Priority Data

Jul. 4, 1983 [JP] Japan .................. 58-121385

[51] Int. Cl.$^4$ .................. H03K 3/26; H03K 17/60
[52] U.S. Cl. .................. 307/270; 307/300; 307/570
[58] Field of Search .................. 307/270, 280, 300, 570

[56] References Cited

U.S. PATENT DOCUMENTS 4,308,577 12/1981 Mentler .................. 307/280
4,356,408 10/1982 Glennon .................. 307/300

OTHER PUBLICATIONS

IBM Tech. Dsclre. Bttn., "Switching Regulator with Transistor Turnoff", by C. J. Palmucci, vol. 16, No. 4, Sep. 1973, p. 1161.

Primary Examiner—Stanley D. Miller
Assistant Examiner—B. P. Davis
Attorney, Agent, or Firm—Townsend & Townsend

[57] ABSTRACT

An input drive apparatus of a power transistor is constituted by a transformer having a core with an air gap, a primary winding energized from an input source in accordance with a forward input bias instruction, and a secondary winding, a first transistor electrically insulated from the input source and turned ON by the voltage of the secondary winding for supplying a forward input bias to the power transistor, and a second transistor electrically insulated from the input source and turned ON in accordance with a reverse input bias instruction for supplying electromagnetic energy stored in the transformer to the input electrode of the power transistor to act as a reverse bias current in accordance with a reverse bias instruction. These is also provided diode means for returning to the input source the electromagnetic energy stored after charge carriers accumulated in the power transistor have been extinguished, and the electromagnetic energy stored in the transformer when a forward bias instruction is applied.

2 Claims, 2 Drawing Figures

INPUT DRIVE APPARATUS FOR POWER TRANSISTOR

BACKGROUND OF THE INVENTION

This invention relates to an input drive apparatus of a power transistor utilized for a pulse width modulation (PWM) inverter, or the like.

For causing a power transistor to effect a high speed switching operation it is important to interrupt the power transistors at a high speed. In order to effect such high speed operation it is necessary to pass a large base reverse current for quickly extinguishing charge carriers accumulated in the transistor.

FIG. 1 shows one example of the prior art base drive apparatus of a transistor inverter, in which the circuit bounded by dash and dot lines represents the base drive circuit of a power transistor 10.

The circuit comprises an operating switch 1 connected to a source $V_d$ for producing a forward bias or a reverse bias, a two phase oscillator 2 for producing square wave voltages A and B of opposite phase, two input AND gate circuits 3a and 3b respectively inputted with the output A or B of the two phase oscillator 2 and the output of the switch 1, and an inverter 4 which inverts the output of switch 1 and applies the inverted output to the base electrode of an NPN transistor 5c. The outputs of the AND gate circuits 3a and 3b are applied to the base electrodes of NPN transistors 5a and 5b respectively. The collector electrode of the transistor 5a is connected to the source $V_d$ via the primary winding of a transformer 6a, the collector electrode of the transistor 5b is connected to the source $V_d$ via the primary winding of a transformer 6b, and the collector electrode of the transistor 5c is also connected to the source $V_d$ via the primary winding of the transformer 6c. The emitter electrodes of the transistors 5a, 5b and 5c are commonly grounded.

The upper terminals of the secondary windings of transformers 6a and 6b are connected to the base electrode of a power transistor 10, while the lower terminals of these secondary windings are connected to the emitter electrode of the power transistor 10 respectively through diodes 7a and 7b and a resistor 8a. The upper terminal of the secondary winding of the transformer 6c is connected to the base electrode of an NPN transistor 5d via resistor 8b, while the lower terminal is connected to the emitter electrode of the transistor 5d, the collector electrode thereof being connected to the base electrode of the power transistor 10 via a source 9 of reverse bias voltage. The emitter electrode of the transistor 5d is connected to the emitter electrode of the power transistor 10, and the output of switch 1 is connected to the emitter electrode of transistor 5c through a resistor 8c.

With the circuit described above, when the switch 1 is closed, AND gate circuits 3a and 3b output the logical products of the output of the switch 1 and the outputs A or B of the two phase oscillators 2. While the switch 1 is closed, the outputs of the AND gate circuits 3a and 3b are applied to the base electrodes of the transistors 5a and 5b respectively so as to induce chopped or intermittent square wave voltages in the secondary windings of transformers 6a and 6b. These square wave voltages are rectified by the diodes 7a and 7b respectively and supplied across the base and emitter electrodes of the power transistor 10 for supplying forward bias current through the resistor 8a.

When the switch 1 is opened, an operation opposite to that effected when the switch 1 is closed is performed so that AND gate circuits 3a and 3b are disabled, whereby the supply of the bias voltage to the base electrode of the power transistor 10 is interrupted.

When the switch 1 is opened, the inverter 4 inverts the output of switch 1 to turn ON the transistor 5c. Consequently, the transistor 5d is turned ON through the transformer 6c, and the resistor 8b with the result that a reverse bias current $I_B$ is supplied between the base and emitter electrodes of the power transistor 10 from the source of reverse bias voltage 9 through the transistor 5d.

As above described, in the circuit shown in FIG. 1, for the purpose of turning OFF at a high speed the power transistor 10, the transistor 5d is turned ON to pass large reverse bias current $I_B$. However, even when the switch 1 is opened, before the charge carriers accumulated in the transistors 5a and 5b are extinguished, the transformers 6a and 6b continue to produce output voltages, and as the transistor 5d has been ON, the source of reverse bias voltage 9 is required to supply a large power.

Even when charge carriers accumulated in the transistors 5a and 5b have been extinguished, the current $I_S$ supplied from the source of reverse bias voltage 9 is divided into reverse bias currents $I_R$ and $I_B$ which also increases the power of the source of reverse bias voltage 9.

Accordingly, in order to decrease the power of the source of reverse bias voltage 9 it is necessary to pass reverse bias current through transistors 5a and 5b so as to shorten as much as possible the time of extinguishing the accumulated charge carriers. Futhermore, it is necessary to make the resistor 8a to have a high resistance so that no reverse current $I_R$ would flow while the switch 1 is open.

Recently, as the capacity of the power transistor (bipolar transistor or FET) 10 has been increased to 50 W or more (when two or more power transistors are connected in parallel, much more output can be obtained) it is necessary to provide a base drive circuit of the power transistor having a simplified construction and which can cut OFF the power transistor 10 at a higher speed.

SUMMARY OF THE INVENTION

Accordingly, it is an object of this invention to provide an improved input drive apparatus of a power transistor capable of obviating difficulties of the prior art circuit described above.

Another object of this invention is to provide an improved input drive apparatus of a power transistor which is not required to use a source of reverse bias voltage isolated from other circuit elements with transformers.

Still another object of this invention is to provide an input drive apparatus of a power transistor capable of turning OFF the same in a shorter time with lesser power than the prior art base drive apparatus.

A further object of this invention is to provide an improved input drive apparatus of a transistor capable of efficiently utilizing the reverse bias current when a transistor supplying the reverse bias current is turned ON.

According to this invention, these and other ojects can be accomplished by providing an input drive apparatus of a power transistor comprising transformer means with an air gap, a primary winding energized from an input source in accordance with a forward base bias instruction and a secondary winding; a first transistor electrically insulated from the input source and turned ON by the voltage of the secondary winding for supplying a forward input bias to the power transistor; a second transistor electrically insulated from the input source and turned ON in accordance with a reverse input bias instruction for supplying electromagnetic energy stored in the transformer means to the input electrode of the power transistor to act as a reverse bias current in accordance with a reverse bias instruction; and diode means for returning to the input source the electromagnetic energy stored in the transformer means after charge carriers accumulated in the power transistor have been extinguished, and the electromagnetic energy stored in the transformer means when a forward bias instruction is applied.

DESCRIPTION OF THE PREFERRED EMBODIMENT

Figure 1:
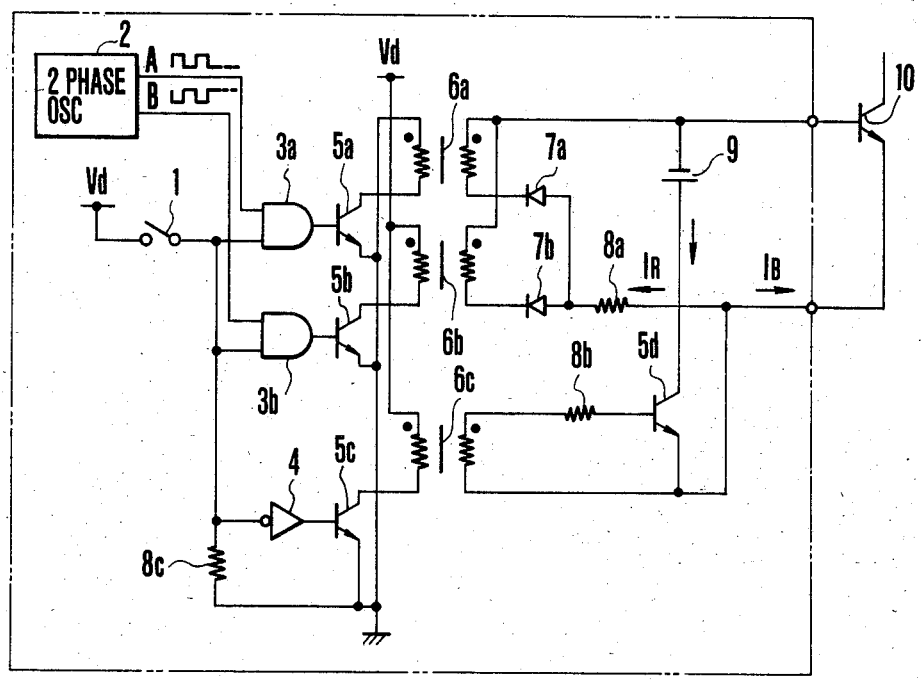
FIG. 1 a connection diagram of a prior art base drive apparatus of a prior art transistor inverter and FIG. 2 is a connection diagram showing one embodiment of the input drive apparatus of a transistor inverter according to this invention.
Figure 2:
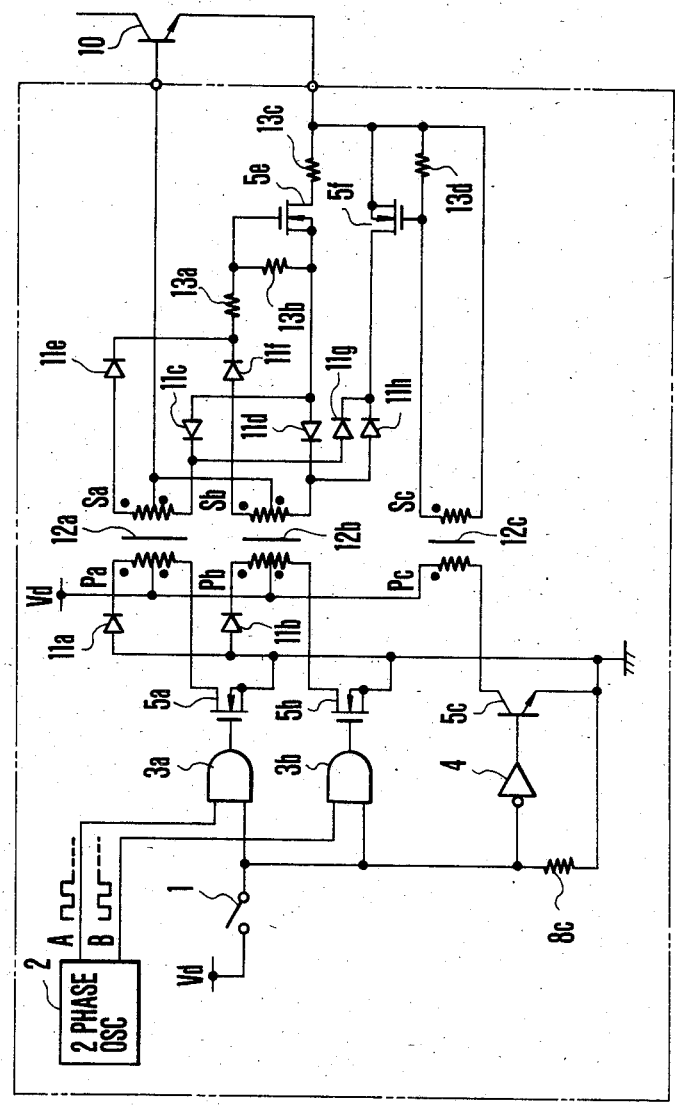
Figure 1:
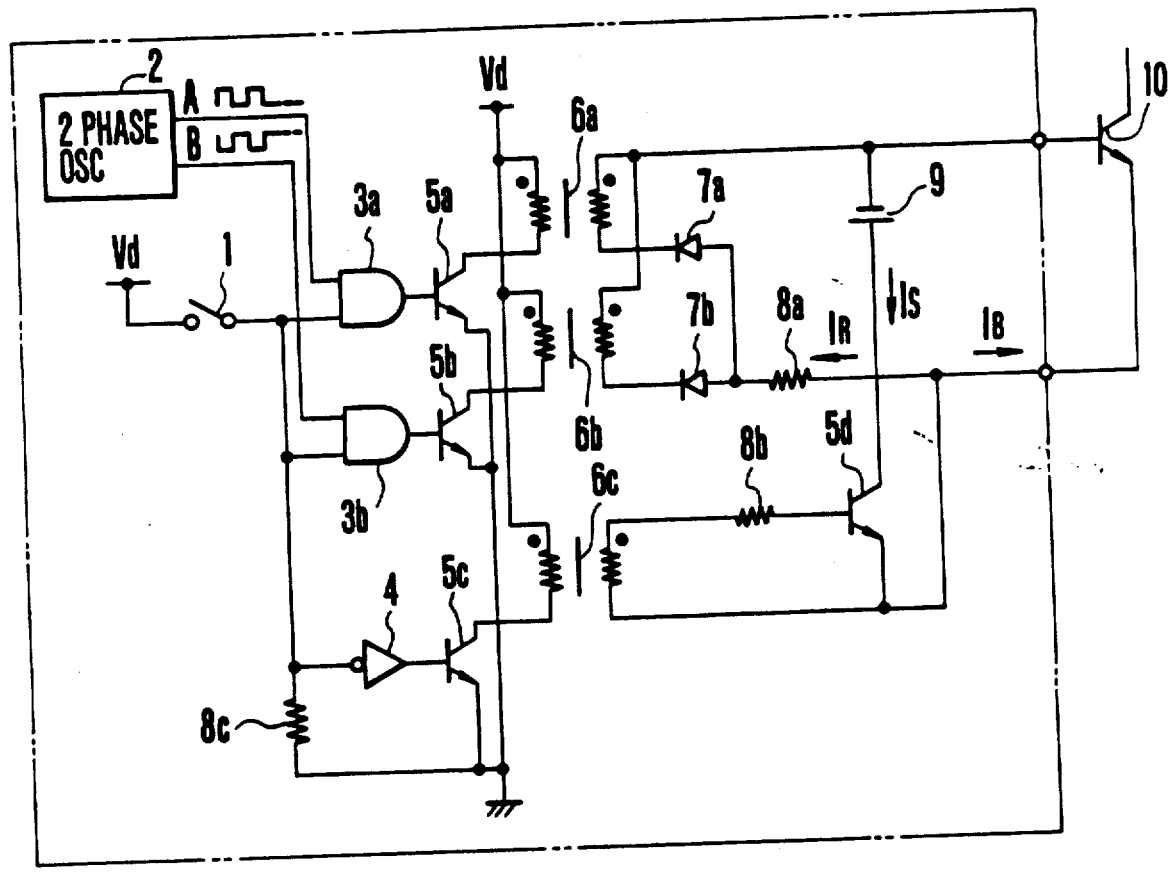

In FIG. 2 showing one embodiment of this invention, circuit elements corresponding to those shown in FIG. 1 are designated by the same reference numerals. Transistors 5a, 5b, 5e and 5f may be conventional bipolar transistors but illustrated herein as MOS type field effect transistors (hereinafter, merely termed FET). The FET 5e is electrically insulated from the input source and turned ON by the secondary voltage to be described later in accordance with a forward base bias instruction to supply a forward bias voltage to the base electrode of the power transistor 10. The FET 5f is also electrically insulated from the input source and turned ON in accordance with a reverse base bias instruction for supplying electromagnetic energy stored in the transformer to the base electrode of the power transistor 10 to act as a reverse bias current.

11a to 11h show diodes, and 12a and 12b are transformers with air gaps. The reason for using transformers with air gaps lies in the fact that the air gap increases the mutual inductance M of the transformer so that the current flowing into the transformer can be set as shown by the following equation which makes it possible to determine the desired energy quantity $(\frac{1}{2})Mi^2$.

$$i = (V_d/M)t = V_d/2fM$$

12c shows an ordinary transformer, and 13a to 13d are resistors. The diodes 11a and 11b are used to regenerate the electromagnetic energy stored in the transformers 12a, 12b to the source Vd after the charge carriers accumulated in the power transistor 10 have been once extinguished and the electromagnetic energy stored at the time of instructing a forward base bias. The diodes 11c to 11f are used as rectifiers, and the transformers 12a and 12b with air gaps are energized from the source $V_d$ in accordance with a forward base bias instruction.

The gate electrode of FET 5a is connected to the output of the AND gate circuit 3a, the drain electrode is connected to ground via a series connection of the primary winding $P_a$ of transformer 12a and diode 11a. The gate electrode of FET 5b is connected to the output of the AND gate circuit 3b, and the drain electrode is connected to ground via a series connection of the primary winding $P_b$ of transformer 12b and diode 11b. The source electrodes of FETs 5a and 5b are directly grounded. The mid taps of the primary windings $P_a$ and $P_b$ of the transformers 12a and 12b are connected to the source $V_d$. The upper terminal of the secondary winding of the transformer 12a is connected to the gate electrode of FET 5e through a series connection of the forwardly connected diode 11e and the resistor 13a, while the lower terminal of the secondary winding $S_a$ is connected to the source electrode of FET 5e through the reversely connected diode 11c, and connected to the drain electrode of FET 5f through the forwardly connected diode 11g. The upper terminal of the secondary winding $S_b$ of the transformer 12b is connected to the gate electrode of FET 5e through a series connection of the forwardly connected diode 11f and the resistor 13a, while the lower terminal of the secondary winding $S_b$ is connected to the source electrode of FET 5e the through reversely connected diode 11d and to the drain electrode of FET 5f through the forwardly connected diode 11h. The mid taps of the secondary windings $S_a$ and $S_b$ of the transformers 12a and 12b are commonly connected to the base electrode of the power transistor 10.

Additionally, the primary and secondary windings of the transformers 12a, 12b and 12c are wound in the same direction, and FETs 5a and 5b have a function of expediting switching besides the function of supplying the primary windings of the transformers 12a and 12b with Vd.

The drain electrode of FET 5e is connected to the emitter electrode of the power transistor 10, while the source electrode of FET 5e is connected to its gate electrode thereof through the resistor 13b. The gate electrode of FET 5f is connected to the upper terminal of the secondary winding $S_c$ of the transformer 12c and to the emitter eletrode of the power transistor 10 via the resistor 13d, while the source electrode is directly connected to the emitter electrode of the power transistor 10. The lower terminal of the secondary winding $S_c$ of the transformer 12c is connected to the emitter electrode of the power transistor 10.

The embodiment of this invention shown in FIG. 2 operates as follows:

When switch 1 is closed, the AND gate circuits 3a and 3b produce logical products of the output of the switch 1 and the outputs A or B of the two phase oscillator 2. The outputs of these AND gate circuits 3a and 3b produce intermittent square wave voltages in the secondary windings $S_a$ and $S_b$ of the transformers 12a and 12b respectively through FETs 5a and 5b. Since the transformers 12a and 12b are provided with air gaps they store sufficiently large electromagnetic energy. The outputs of the transformers 12a and 12b are respectively rectified by diodes 11c to 11f, and the rectified outputs are suppllied to the gate electrode of FET 5e through the resistor 13a to act as a forward bias voltage so as to turn ON FET 5e. When this FET 5e is turned ON, it supplies a forward bias current to the power transistor 10 via the resistor 13c.

While the switch 1 is closed, the electromagnetic energy stored during each ON cycle period of the chopper transformers 12a and 12b is returned to the source $V_d$ through diode 11a or 11b during each OFF cycle period of transformers 12a and 12b.

When the switch 1 is opened, the FETs 5a and 5b are turned OFF by the operation opposite to that during an interval in which the switch 1 is closed. At the same time, the inverter 4 inverts the output of the switch 1 and its inverted output turns ON the transistor 5c so as to apply a forward bias voltage to the gate electrode of FET 5f, thus turning ON the same at this time, the electromagnetic energy stored in the transformers 12a and 12b supplies a large base reverse bias current to the power transistor via diode 11g or 11h and via FET 5f. Under these conditions, even when FET 5e is ON due to its residual charge carrriers, as diodes 11c to 11f are reversely biased, no current flows through FET 5e. Consequently, all magnetic energy is efficiently supplied to the base electrode of the power transistor 10.

When the charge carriers accumulated in the power transistor 10 have been completely extinguished, the remaining electromagnetic energy is returned to the source $V_d$ through diode 11a or 11b. When the secondary voltages of the transformers 12a and 12b are selected to be equal to the permissible value of the base reverse bias voltage of the power transistor 10, the electromagnetic energy would be discharged to the primary side whose relative potential difference becomes large, at the time when the accumulated charge carriers are completely extinguished and the discharged electromagnetic energy is returned to the source $V_d$ through diode 11a or 11b.

Where FETs are used, the effect of the accumulation time of FETs 5a and 5b can be neglected. Moreover, it becomes unnecessary to provide a source of reverse bias voltage for the power transistor electrically isolated from the input source by the transformers 12a to 12c. Moreover, since FET 5e is provided for suplying the reverse bias voltage, it is possible to efficiently utilize the reverse bias current when FET 5f is ON.

As above described, according to this invention, it is possible to substantially ignore the effect of the accumulated charge carriers with a simple circuit construction not utilizing a source for supplying a reverse bias source for a power transistor as in the prior art. Moreover, since field effect transistors are used as switches for supplying a forward bias voltage the reverse bias current can be efficiently used when the field effect transistors for supplying the reverse bias current are turned ON.

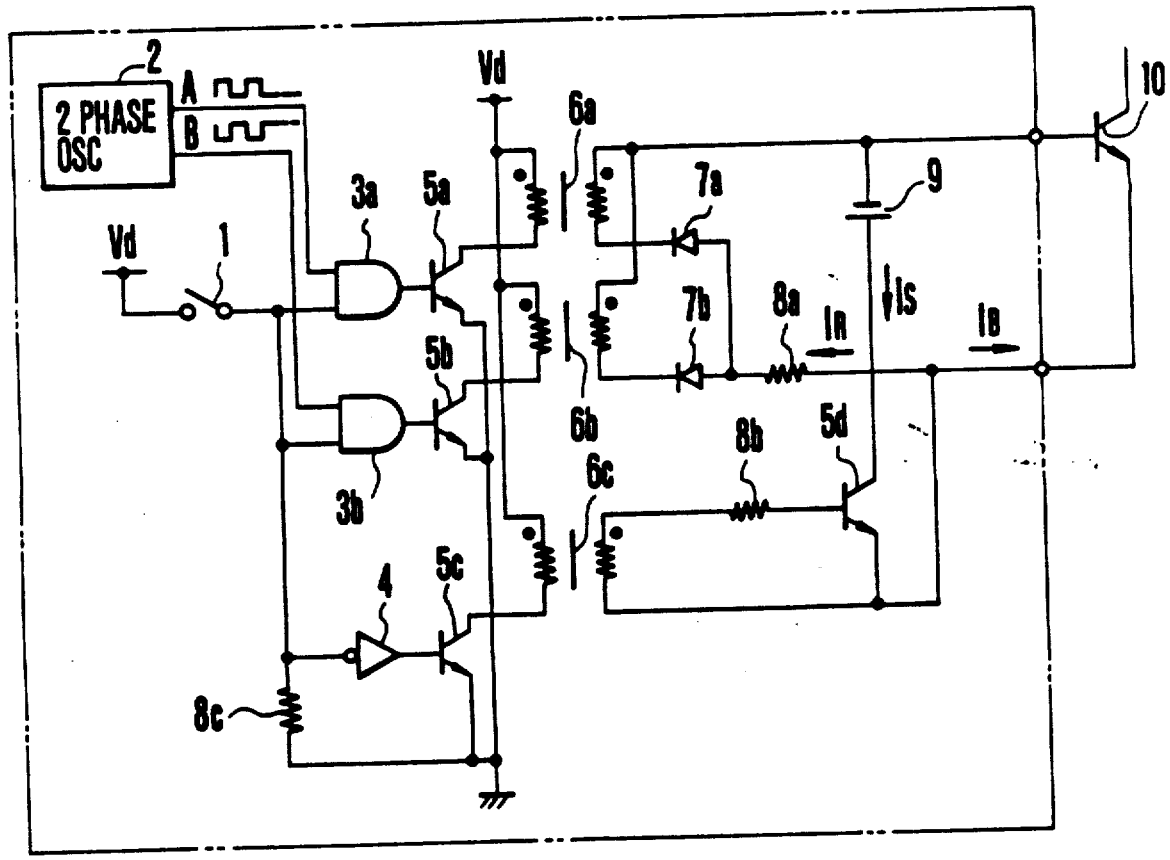

What is claimed is:

1. An input drive apparatus of a power transistor having an input side circuit means and output side circuit means electrically insulated from each other by gaps between primary and secondary windings of at least one first transformer and a second transformer respectively, said input side circuit means including a power source, means for alternately connecting said power source to the primary windings of said at least one first transformer and said second transformer in accordance with a value of an instruction signal for controlling a bias voltage applied across a first and a second electrode of said power transistor, said output side circuit means comprising:
    means for connecting a first electrode of said power transistor with a center tap of the secondary winding of said at least one first transformer,
    at least one first diode having one electrode connected with one terminal of the secondary winding of the corresponding one of said at least one first transformer,
    at least one second diode having one electrode of opposite polarity from that of the first diode connected with the other terminal of the secondary winding of the corresponding one of said at least one first transformer,
    first transistor means having a first terminal connected with the second electrode of said power transistor, a second terminal connected with the other electrode of the second diode and a third terminal connected with the other electrode of the first diode, an internal current path from the first terminal to the second terminal of said first transistor means being established when a voltage is applied across the second and third terminals thereof,
    at least one third diode having one electrode of opposite polarity from that of the second diode connected with the other terminal of the secondary winding of the corresponding one of said at least one first transformer,
    second transistor means having a fourth terminal connected with the other electrode of the corresponding one of said third diode, a fifth terminal connected with the second electrode of said power transistor and sixth and seventh terminals respectively connected with one and the other terminals of the secondary winding of said second transformer, an internal current path from the fourth terminal to the fifth terminal being established when a voltage is applied across the sixth and seventh terminals; and
    said input side circuit means comprising means for connecting each center tap of the primary winding of said at least one first transformer with said power source, and at least one fourth diode having one electrode connected with one terminal of the primary winding of the corresponding one of said at least one first transformer and the other electrode grounded so that the electromagnetic energy stored in said first transformer means is regenerated to said power source after charge carriers accumulated in said power transistor have been extinguished.

2. The input drive apparatus according to claim 1 wherein said first transistor means comprises a first field effect transistor (FET) having a drain electrode connected to said first terminal through a resistor, a source electrode connected to said second terminal and a gate electrode connected to said third terminal through a resistor, and a resistor connected across the second and third terminals; and said second transistor means comprises a second FET having a drain electrode connected to said fourth terminal, a source electrode connected to said fifth and seventh terminals, and a gate electrode connected to said sixth terminal, and a resistor connected across the sixth and seventh terminals.

* * * * *

UNITED STATES PATENT AND TRADEMARK OFFICE
CERTIFICATE OF CORRECTION

PATENT NO. : 4,605,865
DATED : Aug. 12, 1986
INVENTOR(S) : I. Yuzurihara

It is certified that error appears in the above-identified patent and that said Letters Patent is hereby corrected as shown below:

The title page and Figure 1 of the Drawings should be deleted to appear as per attached sheets.

Signed and Sealed this

Sixteenth Day of December, 1986

Attest:

DONALD J. QUIGG

Attesting Officer

Commissioner of Patents and Trademarks

United States Patent [19]

Yuzurihara

[11] Patent Number: 4,605,865
[45] Date of Patent: Aug. 12, 1986

[54] INPUT DRIVE APPARATUS FOR POWER TRANSISTOR

[75] Inventor: Itsuo Yuzurihara, Zama, Japan

[73] Assignee: Kyosan Electric Co., Ltd., Kanagawa, Japan

[21] Appl. No.: 624,633

[22] Filed: Jun. 26, 1984

[30] Foreign Application Priority Data

Jul. 4, 1983 [JP] Japan ................................ 58-121385

[51] Int. Cl.⁴ ........................ H03K 3/26; H03K 17/60
[52] U.S. Cl. ................................... 307/270; 307/300; 307/570
[58] Field of Search ................. 307/270, 280, 300, 570

[56] References Cited

U.S. PATENT DOCUMENTS 4,308,577 12/1981 Mentler ............................ 307/280
4,356,408 10/1982 Glennon ........................... 307/300

OTHER PUBLICATIONS

IBM Tech. Dsclre. Bttn., "Switching Regulator with Transistor Turnoff", by C. J. Palmucci, vol. 16, No. 4, Sep. 1973, p. 1161.

Primary Examiner—Stanley D. Miller
Assistant Examiner—B. P. Davis
Attorney, Agent, or Firm—Townsend & Townsend

[57] ABSTRACT

An input drive apparatus of a power transistor is constituted by a transformer having a core with an air gap, a primary winding energized from an input source in accordance with a forward input bias instruction, and a secondary winding, a first transistor electrically insulated from the input source and turned ON by the voltage of the secondary winding for supplying a forward input bias to the power transistor, and a second transistor electrically insulated from the input source and turned ON in accordance with a reverse input bias instruction for supplying electromagnetic energy stored in the transformer to the input electrode of the power transistor to act as a reverse bias current in accordance with a reverse bias instruction. These is also provided diode means for returning to the input source the electromagnetic energy stored after charge carriers accumulated in the power transistor have been extinguished, and the electromagnetic energy stored in the transformer when a forward bias instruction is applied.

2 Claims, 2 Drawing Figures